United States Patent
Takahashi et al.

(10) Patent No.: US 11,871,514 B2
(45) Date of Patent: Jan. 9, 2024

(54) FLEXIBLE PRINTED CIRCUIT BOARD AND METHOD FOR PRODUCING THE SAME

(71) Applicants: SUMITOMO ELECTRIC INDUSTRIES, LTD., Osaka (JP); SUMITOMO ELECTRIC PRINTED CIRCUITS, INC., Koka (JP)

(72) Inventors: Kenji Takahashi, Osaka (JP); Shoichiro Sakai, Osaka (JP)

(73) Assignees: SUMITOMO ELECTRIC INDUSTRIES, LTD., Osaka (JP); SUMITOMO ELECTRIC PRINTED CIRCUITS, INC., Koka (JP)

( * ) Notice: Subject to any disclaimer, the term of this patent is extended or adjusted under 35 U.S.C. 154(b) by 65 days.

(21) Appl. No.: 17/627,114

(22) PCT Filed: Mar. 26, 2021

(86) PCT No.: PCT/JP2021/012774
§ 371 (c)(1),
(2) Date: Jan. 13, 2022

(87) PCT Pub. No.: WO2021/200614
PCT Pub. Date: Oct. 7, 2021

(65) Prior Publication Data
US 2022/0279652 A1  Sep. 1, 2022

(30) Foreign Application Priority Data
Apr. 1, 2020 (JP) .................. 2020-066298

(51) Int. Cl.
*H05K 1/09* (2006.01)
*C25D 3/38* (2006.01)
(Continued)

(52) U.S. Cl.
CPC ............... *H05K 1/09* (2013.01); *C25D 3/38* (2013.01); *C25D 7/00* (2013.01); *H05K 1/028* (2013.01); *H05K 3/188* (2013.01)

(58) Field of Classification Search
None
See application file for complete search history.

(56) References Cited

U.S. PATENT DOCUMENTS 6,379,745 B1 *  4/2002  Kydd ................ H01L 23/49883
                                                              427/98.4
9,232,649 B2 *  1/2016  Nagata .................. H05K 3/388
(Continued)

FOREIGN PATENT DOCUMENTS

JP   H07-102392 A   4/1995
JP   H08-064930 A   3/1996
(Continued)

OTHER PUBLICATIONS

JP 2011/014848 A (translation) (Year: 2023).*
Encyclopedia Britannica (Year: 2010).*

*Primary Examiner* — Hoa C Nguyen
*Assistant Examiner* — John B Freal
(74) *Attorney, Agent, or Firm* — Oliff PLC (57) ABSTRACT

A flexible printed circuit board according to an aspect is a flexible printed circuit board including a base film and a wiring layer disposed on at least one surface of the base film and having a plurality of wiring lines. The wiring lines have an average line width of 30 μm or less and an average spacing of 30 μm or less. The wiring lines have a copper-based plating layer. The copper-based plating layer has an electrical resistivity of more than $1.68 \times 10^{-8}$ Ω·m.

10 Claims, 2 Drawing Sheets

(51) Int. Cl.
    *C25D 7/00*     (2006.01)
    *H05K 1/02*     (2006.01)
    *H05K 3/18*     (2006.01)

(56) References Cited

U.S. PATENT DOCUMENTS

| | | |
|---|---|---|
| 2001/0051707 A1* | 12/2001 | Fukuoka ............... G11B 5/484 |
| | | 528/340 |
| 2006/0207886 A1 | 9/2006 | Isono et al. |
| 2009/0092789 A1 | 4/2009 | Tsuchida et al. |
| 2014/0102773 A1 | 4/2014 | Nagata |
| 2017/0135206 A1 | 5/2017 | Jeda et al. |
| 2018/0054900 A1 | 2/2018 | Ueda et al. |
| 2020/0015353 A1 | 1/2020 | Takahashi et al. |

FOREIGN PATENT DOCUMENTS

| | | | |
|---|---|---|---|
| JP | 2006-057177 A | | 3/2006 |
| JP | 2007-131931 A | | 5/2007 |
| JP | 2011-014721 A | | 1/2011 |
| JP | 2011014848 A | * | 1/2011 |
| JP | 2012-522898 A | | 9/2012 |
| JP | 2014-082320 A | | 5/2014 |
| JP | 2016-009854 A | | 1/2016 |
| JP | 2018-195681 A | | 12/2018 |
| WO | 2007/039992 A1 | | 4/2007 |
| WO | 2010/115756 A1 | | 10/2010 |
| WO | 2016/104530 A1 | | 6/2016 |
| WO | 2016/147993 A1 | | 9/2016 |

* cited by examiner

FLEXIBLE PRINTED CIRCUIT BOARD AND METHOD FOR PRODUCING THE SAME

TECHNICAL FIELD

The present disclosure relates to a flexible printed circuit board and a method for producing the same. The present application claims priority based on Japanese Patent Application No. 2020-066298 filed on Apr. 1, 2020, and the entire contents of the Japanese patent application are incorporated herein by reference.

BACKGROUND ART

Flexible printed circuit boards are widely used to constitute circuits of various electronic devices. In recent years, with the size reduction of electronic devices, the size reduction of flexible printed circuit boards and the increase in wiring density of flexible printed circuit boards have been increasingly progressing.

As such a small flexible printed circuit board, there has been proposed a flexible printed circuit board that includes a sheet-like insulating substrate and a coil-like wiring layer formed on a surface of the substrate by plating (refer to Japanese Unexamined Patent Application Publication No. 2018-195681).

Meanwhile, it has been proposed that an electroplating solution that contains copper ions, sulfuric acid, chloride ions, and a hydroxy carboxylic acid is used as a plating solution of electroplating for forming wiring lines on a flexible printed circuit board (refer to Japanese Unexamined Patent Application Publication No. 7-102392).

CITATION LIST

Patent Literature

PTL 1: Japanese Unexamined Patent Application Publication No. 2018-195681
PTL 2: Japanese Unexamined Patent Application Publication No. 7-102392

SUMMARY OF INVENTION

A flexible printed circuit board according to an aspect of the present disclosure is a flexible printed circuit board including a base film and a wiring layer disposed on at least one surface of the base film and having a plurality of wiring lines. In the flexible printed circuit board, the wiring lines have an average line width of 30 µm or less and an average spacing of 30 µm or less, the wiring lines have a copper-based plating layer, and the copper-based plating layer has an electrical resistivity of more than $1.68 \times 10^{-8}$ Ω·m.

A method for producing a flexible printed circuit board according to another aspect of the present disclosure is a method for producing a flexible printed circuit board including a base film and a wiring layer disposed on at least one surface of the base film and having a plurality of wiring lines, the wiring lines having an average line width of 30 µm or less and an average spacing of 30 µm or less, the wiring lines having a copper-based plating layer, the copper-based plating layer having an electrical resistivity of more than $1.68 \times 10^{-8}$ Ω·m. The method includes a step of stacking a conductive underlying layer on at least one surface of the base film; a step of forming a resist pattern on a surface of the conductive underlying layer; a step of forming a copper-based plating layer in an opening of the resist pattern on the conductive underlying layer by electroplating in a plating solution; and a step of removing the resist pattern and a region of the conductive underlying layer, the region not having the copper-based plating layer thereon. In the method, the plating solution contains a first organic compound, a second organic compound, and a third organic compound, the first organic compound includes disodium 3,3'-dithiobis(1-propanesulfonate), the second organic compound includes polyethylene glycol, and the third organic compound includes a nitrogen-containing organic compound.

DESCRIPTION OF EMBODIMENTS

Problems to be Solved by Present Disclosure

In flexible printed circuit boards, the electrical resistance of wiring lines is desired to be increased in some cases in order to conform to various design standards. In this regard, in the flexible printed circuit boards described above, it is necessary to reduce the line widths of wiring lines or to increase the lengths of wiring lines in order to increase the electrical resistance of the wiring lines. However, if such a change in a dimension is performed in the current situation in which the size reduction has been progressing as described above, it may become difficult to achieve the size reduction or it may become difficult to satisfy design standards other than the electrical resistance.

In view of the above, it is an object to provide a flexible printed circuit board that can conform to various design standards while achieving a reduction in size, and a method for producing the flexible printed circuit board.

Advantageous Effects of Present Disclosure

A flexible printed circuit board according to an aspect of the present disclosure can conform to various design standards while achieving a reduction in size. A method for producing a flexible printed circuit board according to another aspect of the present disclosure enables the production of a flexible printed circuit board that can conform to various design standards while achieving a reduction in size.

Description of Embodiments of Present Disclosure

A flexible printed circuit board according to an aspect of the present disclosure is a flexible printed circuit board including a base film and a wiring layer disposed on at least one surface of the base film and having a plurality of wiring lines. In the flexible printed circuit board, the wiring lines have an average line width of 30 µm or less and an average spacing of 30 µm or less, the wiring lines have a copper-based plating layer, and the copper-based plating layer has an electrical resistivity of more than $1.68 \times 10^{-8}$ Ω·m.

Since the flexible printed circuit board has an average line width and an average spacing of the wiring lines within the above ranges, a reduction in size is achieved. In addition, since the wiring lines have a copper-based plating layer, the electrical resistance of the wiring lines can be increased in comparison among wiring lines having the same dimensions. Accordingly, the flexible printed circuit board can conform to various design standards while achieving a reduction in size.

The electrical resistivity of the copper-based plating layer may be $1.73 \times 10^{-8}$ $\Omega \cdot m$ or more and $2.10 \times 10^{-8}$ $\Omega \cdot m$ or less.

When the electrical resistivity of the copper-based plating layer is $1.73 \times 10^{-8}$ $\Omega \cdot m$ or more, the flexible printed circuit board can conform to various design standards in a wider range. When the electrical resistivity is $2.10 \times 10^{-8}$ $\Omega \cdot m$ or less, an increase in the unnecessary electrical resistance can be suppressed.

The electrical resistivity of the copper-based plating layer may be $1.73 \times 10^{-8}$ $\Omega \cdot m$ or more and $1.93 \times 10^{-8}$ $\Omega \cdot m$ or less.

When the electrical resistivity of the copper-based plating layer is $1.73 \times 10^{-8}$ $\Omega \cdot m$ or more, the flexible printed circuit board can conform to various design standards in an even wider range. When the electrical resistivity is $1.93 \times 10^{-8}$ $\Omega \cdot m$ or less, an increase in the unnecessary electrical resistance can be further suppressed.

The copper-based plating layer may contain sulfur, nitrogen, and carbon, and in the copper-based plating layer, a content of the sulfur may be 0.0001% by mass or more and 0.005% by mass or less, a content of the nitrogen may be 0.0001% by mass or more and 0.005% by mass or less, and a content of the carbon may be 0.001% by mass or more and 0.01% by mass or less.

When the contents of the sulfur, nitrogen, and carbon are within the above ranges, the electrical resistivity can be more reliably set within the above range.

Copper crystal grains in the copper-based plating layer may have an average diameter of 0.05 µm or more and 100 µm or less.

When the average diameter of the copper crystal grains is within the above range, the electrical resistivity can be more reliably set within the above range.

The wiring lines may further include a first conductive underlying layer in contact with the one surface of the base film, the copper-based plating layer may be disposed on a surface of the first conductive underlying layer, the surface being opposite to a surface in contact with the base film, and the first conductive underlying layer may include a first layer in contact with the one surface of the base film and a second layer disposed on a surface of the first layer, the surface being opposite to a surface in contact with the base film.

In the case where the first layer contains at least one selected from the group consisting of nickel, chromium, titanium, and silver, thermal deterioration of adhesive strength of the wiring layer to the base film can be suppressed.

In the case where the second layer contains 50% by mass or more of copper in the second layer, the time of operation can be shortened when the copper-based plating layer is formed on the surface of the second layer by electroplating.

A method for producing a flexible printed circuit board according to a different aspect of the present disclosure is a method for producing a flexible printed circuit board including a base film and a wiring layer disposed on at least one surface of the base film and having a plurality of wiring lines, the wiring lines having an average line width of 30 µm or less and an average spacing of 30 µm or less, the wiring lines having a copper-based plating layer, the copper-based plating layer having an electrical resistivity of more than $1.68 \times 10^{-8}$ $\Omega \cdot m$. The method includes a step of stacking a conductive underlying layer on at least one surface of the base film; a step of forming a resist pattern on a surface of the conductive underlying layer; a step of forming a copper-based plating layer in an opening of the resist pattern on the conductive underlying layer by electroplating in a plating solution; and a step of removing the resist pattern and a region of the conductive underlying layer, the region not having the copper-based plating layer thereon. In the method, the plating solution contains a first organic compound, a second organic compound, and a third organic compound, the first organic compound includes disodium 3,3'-dithiobis(1-propanesulfonate), the second organic compound includes polyethylene glycol, and the third organic compound includes a nitrogen-containing organic compound.

The third organic compound may include at least one selected from a copolymer of diallyl ammonium and sulfur dioxide, a polyvinylimidazolium quaternary compound, a copolymer of vinylpyrrolidone and a vinylimidazolium quaternary compound, and a quaternary polyamine.

In the plating solution, a content of the first organic compound may be 0.0001% by mass or more and 1% by mass or less, a content of the second organic compound may be 0.004% by mass or more and 5% by mass or less, and a content of the third organic compound may be 0.0001% by mass or more and 0.5% by mass or less.

According to the method for producing a flexible printed circuit board, the above-described flexible printed circuit board can be produced. That is, it is possible to produce a flexible printed circuit board that can conform to various design standards while achieving a reduction in size.

Herein, the "line width" means a dimension of one wiring line in a direction perpendicular to the longitudinal direction of the wiring line, and the "average line width" means a value determined by measuring the maximum width of a wiring line on a section perpendicular to the longitudinal direction of the wiring line at five random positions in the longitudinal direction of the wiring line and averaging the measured values. The "spacing" means a distance in a direction perpendicular to the longitudinal direction of the wiring line between adjacent surfaces of two wiring lines facing each other, and the "average spacing" means a value determined by measuring the distance between adjacent surfaces at five random positions in the longitudinal direction of the wiring lines and averaging the measured values. However, with regard to land parts such as a land part having a via (through-hole, blind via, or filled via) for connecting wiring lines to each other, a land part that is connected to a mounted component, and a land part for connecting to another printed board or connector, these parts are excluded from the "line width" and the "spacing" defined above. The "electrical resistivity" means a value of an electrical resistivity of the copper-based plating layer, at 20° C. The "average diameter" means a value obtained by cutting a section of a wiring line in the thickness direction so as to have a length of 200 µm along the length direction of the wiring line with a focused ion beam (FIB) apparatus, observing the section with an FIB apparatus, a scanning electron microscope (SEM), or a metallographic microscope, measuring the major axis and the minor axis of crystals present in the copper-based plating layer on the section, and averaging the measured values.

Details of Embodiments of Present Disclosure

Embodiments of a flexible printed circuit board according to the present disclosure and a method for producing the same will be described in detail below with reference to the drawings. Note that in the present embodiments, a "front surface side" refers to, in the thickness direction of a base film, a side on which a wiring layer is stacked, and the front and back of the present embodiments do not define the front and back in a use state of a flexible printed circuit board.

Flexible Printed Circuit Board

Figure 1:
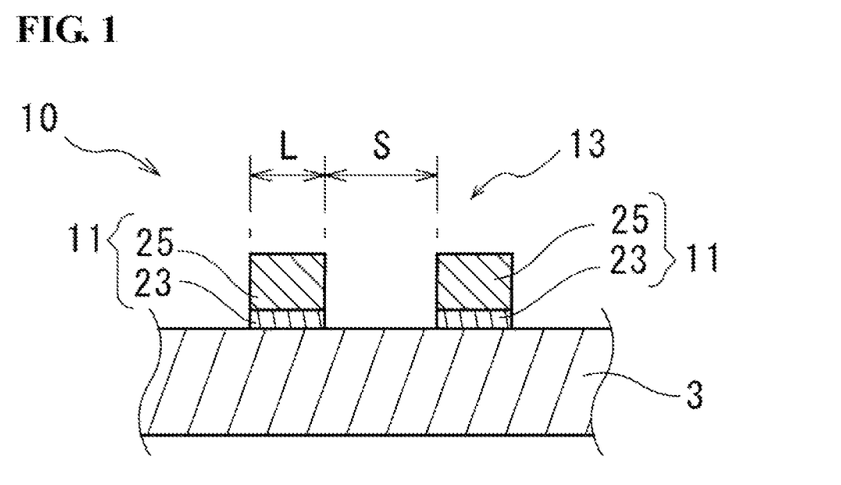
FIG. 1 is a schematic end view illustrating a flexible printed circuit board of an embodiment.

As illustrated in FIG. 1, a flexible printed circuit board 10 of the present embodiment mainly includes an insulating base film 3 and a wiring layer 11 stacked on one surface side (front surface side) of the base film 3 and having a plurality of wiring lines 13. The flexible printed circuit board 10 may further include a cover film on the front surface side of the base film 3 or the wiring layer 11.

Base Film

The base film 3 is an insulating layer composed of a synthetic resin. The base film 3 also has flexibility. This base film 3 also functions as a substrate on which the wiring layer 11 is formed. The material that forms the base film 3 may be any material having an insulating property and flexibility, and a synthetic resin film formed in a sheet shape and having a low dielectric constant can be used as the material. Examples of a main component of this synthetic resin film include polyimide, polyethylene terephthalate, liquid crystal polymers, and fluororesins. The "main component" refers to a component that has the highest content and means, for example, a component that accounts for 50% by mass or more in the forming material. The base film 3 may contain, for example, a resin other than the exemplified resins such as polyimide, and an antistatic agent.

The lower limit of an average thickness of the base film 3 is not particularly limited, and may be 3 µm, 5 µm, or 10 µm. The upper limit of the average thickness of the base film 3 is not particularly limited, and may be 200 µm, 150 µm, or 100 µm. If the average thickness of the base film 3 is less than 3 µm, the dielectric strength and mechanical strength of the base film 3 may become insufficient. On the other hand, if the average thickness of the base film 3 exceeds 200 µm, the flexible printed circuit board 10 may have an excessively large thickness. Herein, the "average thickness" means the average of thicknesses measured at 10 random points.

Wiring Layer

The wiring layer 11 is stacked on the front surface side of the base film 3 either directly or with another layer interposed therebetween. Examples of the wiring lines 13 included in the wiring layer 11 include signal lines for sending signals, current lines for sending a current for electric power supply, and current lines for sending a current for magnetic field generation.

Each of the wiring lines 13 is formed by a first conductive underlying layer 23 stacked on the front surface side of the base film 3 and a copper-based plating layer 25 stacked on a side (front surface side) of the first conductive underlying layer 23 opposite to the base film 3.

The lower limit of an average line width L of the wiring line 13 may be 1 µm, 3 µm, or 5 µm. The upper limit of the average line width L of the wiring line 13 may be 30 µm, 20 µm, or 10 µm. If the average line width L of the wiring line 13 is less than 1 µm, mechanical strength of the wiring line 13 may become insufficient. On the other hand, if the average line width L of the wiring line 13 exceeds 30 µm, a sufficient reduction in size may not be achieved. The "average line width" is a value obtained by exposing a section perpendicular to the length direction of the circuit board 10 at five positions per each wiring line with a section preparation device such as a microtome, measuring the length of a portion having the largest width in the wiring line 13 with a microscope or the like, and calculating the average of the measured values.

When a plurality of wiring lines 13 are disposed to be adjacent to each other, the lower limit of an average spacing S of the wiring lines 13 may be 1 µm, 3 µm, or 5 µm. The upper limit of the average spacing S of the wiring lines 13 may be 30 µm, 20 µm, or 10 µm. If the average spacing S of the wiring lines 13 is less than 1 µm, short-circuit may occur. On the other hand, if the average spacing S of the wiring lines 13 exceeds 30 µm, a sufficient reduction in size may not be achieved. The "average spacing" is a value obtained by exposing a section perpendicular to the length direction of the circuit board 10 at five positions per each wiring line with a section preparation device such as a microtome, measuring the length of a portion having the smallest spacing in the gap between two wiring lines 13 with a microscope or the like, and calculating the average of the measured values.

The lower limit of an average thickness of a wiring line 13 may be 1 µm, 3 µm, or 5 µm. The upper limit of the average thickness of a wiring line 13 may be 30 µm, 20 µm, or 10 µm. If the average thickness is less than 1 µm, mechanical strength may become insufficient. On the other hand, if the average thickness exceeds 30 µm, flexibility of the wiring line 13 may decrease. Herein, the "thickness" means a distance from the upper surface of the base film to the top edge of the wiring line 13 in a sectional view in the perpendicular direction in plan view (thickness direction) of the base film 3. The "average thickness" means the average of thicknesses measured at 10 random points of one wiring line 13. Specifically, the average thickness is obtained by exposing a section perpendicular to the length direction of a wiring line 13 at 10 random positions with a section preparation device such as a microtome, measuring the thickness by sectional observation, and calculating the average of the measured values. The "average thickness" of, for example, other members described below is also a value measured in a similar manner.

Figure 2:
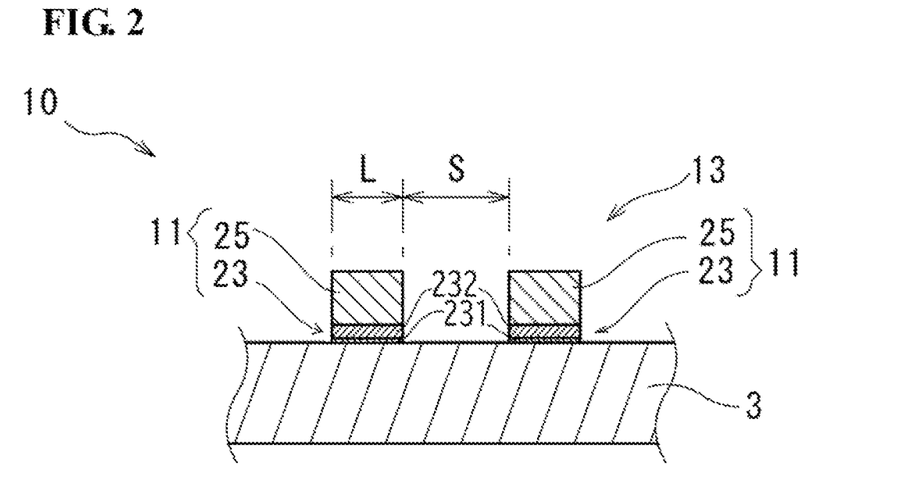
FIG. 2 is a schematic end view illustrating a flexible printed circuit board of an embodiment.

The first conductive underlying layer 23 is formed by a part of a conductive underlying layer M (see, for example, FIG. 3) described below. Examples of the material that forms the first conductive underlying layer 23 include copper (Cu), silver (Ag), gold (Au), nickel (Ni), titanium (Ti), chromium (Cr), and alloys thereof. As illustrated in FIG. 2, the first conductive underlying layer 23 may include a first layer 231 and a second layer 232. With regard to these forming materials, the first conductive underlying layer 23 may include a layer (first layer 231) containing at least one selected from the group consisting of nickel, chromium, titanium, and silver on the side in contact with the base film 3 (for example, polyimide) from the viewpoint of suppressing thermal deterioration of adhesive strength of the wiring layer 11 to the base film 3. Furthermore, the first conductive underlying layer 23 more preferably includes a layer (first layer 231) containing at least one selected from nickel and chromium, which are easily removed to easily maintain insulation. In addition, the first conductive underlying layer 23 more preferably includes a layer (second layer 232) containing copper as a main component on the upper side (the side opposite to the base film 3) of this first layer 231. This configuration in which the layer containing copper as a main component is disposed can shorten the time of operation when the wiring layer 11 is formed by electroplating. The "main component" refers to a component that has the highest content and means, for example, a component that accounts for 50% by mass or more in the second layer 232.

For example, the lower limit of an average thickness of the first layer 231 may be 1 nm or 2 nm. The upper limit of the average thickness of the first layer 231 may be 15 nm or 8 nm. If the average thickness is less than 1 nm, it may become difficult to suppress thermal deterioration of adhesive strength of the wiring layer 11 to the base film 3. On the other hand, if the average thickness exceeds 15 nm, it may become difficult to easily remove the first layer 231, and insulation of the wiring layer 11 may not be sufficiently maintained. This first layer 231 can be formed by, for example, sputtering, electroplating, or electroless plating.

For example, the lower limit of an average thickness of the second layer 232 may be 0.1 μm or 0.2 μm. The upper limit of the average thickness of the second layer 232 may be 2 μm or 1 μm. If the average thickness is less than 0.1 μm, the time taken to form the wiring layer 11 by electroplating may become excessively long. On the other hand, if the average thickness exceeds 2 μm, it may become difficult to easily remove the second layer 232, and insulation of the wiring layer 11 may not be sufficiently maintained. This second layer 232 is preferably formed by, for example, sputtering, electroplating, or electroless plating and may be formed by a combination of these methods. In particular, an electroless copper plating layer is preferably disposed on the uppermost surface side of the first conductive underlying layer 23. With this configuration, in the case where an inner layer inside the electroless copper plating layer is formed by sputtering, defects and the like that can be generated by the sputtering can be covered.

The copper-based plating layer 25 contains copper. The electrical resistivity of this copper-based plating layer 25 is greater than $1.68 \times 10^{-8}$ Ω·m. Usually, the electrical resistivity of a plating layer formed of pure copper is $1.68 \times 10^{-8}$ Ω·m. Thus, the copper-based plating layer 25 has a greater electrical resistivity than a plating layer formed of pure copper.

The electrical resistivity is greater than $1.68 \times 10^{-8}$ Ω·m as described above and, furthermore, may be $1.73 \times 10^{-8}$ Ω·m or more or may be $1.76 \times 10^{-8}$ Ω·m or more. The upper limit of the electrical resistivity may be $2.10 8 \times 10^{-8}$ Ω·m, $1.93 \times 10^{-8}$ Ω·m, or $1.84 \times 10^{-8}$ Ω·m. If the electrical resistivity is less than $1.68 \times 10^{-8}$ Ω·m, it may become difficult to sufficiently conform to various design standards. On the other hand, if the electrical resistivity exceeds $2.10 \times 10^{-8}$ Ω·m, an unnecessary electrical resistance may increase. Herein, the electrical resistance is a value measured at 20° C. by the four point probe method.

The copper content in the copper-based plating layer 25 may be 99.0% by mass or more, 99.5% by mass or more, or 99.9% by mass or more.

An additive other than copper may be contained in the copper-based plating layer 25. For example, the copper-based plating layer 25 may contain sulfur (atoms), nitrogen (atoms), and carbon (atoms). When the copper-based plating layer 25 has each of the above elements (atoms), the electrical resistivity can be more reliably set within the above range.

When the copper-based plating layer 25 contains sulfur, nitrogen, and carbon, the lower limit of the sulfur content in the copper-based plating layer 25 may be 0.0001% by mass, 0.0002% by mass, or 0.0003% by mass. The upper limit of the sulfur content may be 0.005% by mass, 0.004% by mass, or 0.003% by mass. If the sulfur content is less than 0.0001% by mass, it may become difficult to more reliably set the electrical resistivity within the above range. On the other hand, if the sulfur content exceeds 0.005% by mass, similarly, it may become difficult to more reliably set the electrical resistivity within the above range. The sulfur content can be measured on the basis of the high frequency combustion-infrared absorption method (for example, JISG1215-4 (2018) or JISH1070(2013)).

When the copper-based plating layer 25 contains sulfur, nitrogen, and carbon, the lower limit of the nitrogen content in the copper-based plating layer 25 may be 0.0001% by mass, 0.0002% by mass, or 0.0003% by mass. The upper limit of the nitrogen content may be 0.005% by mass, 0.004% by mass, or 0.003% by mass. If the nitrogen content is less than 0.0001% by mass, it may become difficult to more reliably set the electrical resistivity within the above range. On the other hand, if the nitrogen content exceeds 0.005% by mass, similarly, it may become difficult to more reliably set the electrical resistivity within the above range. The nitrogen content can be measured on the basis of the inert gas transportation fusion-thermal conductivity method (for example, JISG1228 (2006)).

When the copper-based plating layer 25 contains sulfur, nitrogen, and carbon, the lower limit of the carbon content in the copper-based plating layer 25 may be 0.001% by mass, 0.002% by mass, or 0.003% by mass. The upper limit of the carbon content may be 0.01% by mass, 0.009% by mass, or 0.008% by mass. If the carbon content is less than 0.001% by mass, it may become difficult to more reliably set the electrical resistivity within the above range. On the other hand, if the carbon content exceeds 0.01% by mass, similarly, it may become difficult to more reliably set the electrical resistivity within the above range. The carbon content can be measured on the basis of the high frequency combustion-infrared absorption method (for example, JISZ2615 (2015) or JISG1211-3(2018)).

Compounds, which are supply sources of sulfur, nitrogen, and carbon, are not particularly limited as long as the compounds contain at least one of these and can allow sulfur, nitrogen, and carbon to be contained in the copper-based plating layer 25 in the corresponding amounts described above. For example, a compound that contains sulfur and carbon is an organic compound containing sulfur (sulfur-containing organic compound, hereinafter also referred to as a "first organic compound"). An example of this first organic compound is disodium 3,3'-dithiobis(1-propanesulfonate) (SPS). For example, a compound that contains carbon is an organic compound (hereinafter also referred to as a "second organic compound"). An example of this second organic compound is polyethylene glycol (PEG). PEG may be one having a weight-average molecular weight of 1,000 or more. Herein, the weight-average molecular weight is measured by gel permeation chromatography (GPC). For example, a compound that contains nitrogen and carbon is an organic compound containing nitrogen (nitrogen-containing organic compound, hereinafter also referred to as a "third organic compound"). Examples of this third organic compound include copolymers of diallyl ammonium and sulfur dioxide, polyvinylimidazolium quaternary compounds (PVI quaternary compounds), copolymers of vinylpyrrolidone and a vinylimidazolium quaternary compound, and quaternary polyamines. Of these, for example, SPS, PEG, and a copolymer of diallyl ammonium and sulfur dioxide can be used as a mixture such that the contents of sulfur, nitrogen, and carbon in the copper-based plating layer 25 are within the above ranges.

The copper-based plating layer 25 may contain copper, and sulfur, nitrogen, and carbon in the amounts described above, with the balance being incidental impurities. Herein, the "incidental impurities" refer to impurities contained in the copper-based plating layer 25 in an amount of less than 0.0001% by mass.

The material (forming material) for forming the copper-based plating layer 25 contains a first metal material. This first metal material is a copper-based metal material. The copper content in the first metal material may be 99.0% by mass or more, may be 99.5% by mass or more, or may be 99.9% by mass or more.

The forming material may contain sulfur, nitrogen, and carbon in addition to the first metal material. The contents of sulfur, nitrogen, and carbon in the forming material can be set within the corresponding ranges described above.

To set the contents of sulfur, nitrogen, and carbon in the copper-based plating layer 25 to the corresponding contents described above, the contents of the first organic compound, the second organic compound, and the third organic compound in a plating solution are each preferably adjusted as described below.

The lower limit of the content of the first organic compound in the plating solution may be 0.0001% by mass, 0.0005% by mass, or 0.001% by mass. The upper limit of the content of the first organic compound in the plating solution may be 1% by mass, 0.1% by mass, or 0.05% by mass.

The lower limit of the content of the second organic compound in the plating solution may be 0.004% by mass, 0.02% by mass, or 0.04% by mass. The upper limit of the content of the second organic compound in the plating solution may be 5% by mass, 1% by mass, or 0.5% by mass.

The lower limit of the content of the third organic compound in the plating solution may be 0.0001% by mass, 0.0005% by mass, or 0.001% by mass. The upper limit of the content of the third organic compound in the plating solution may be 0.5% by mass, 0.1% by mass, or 0.005% by mass.

By adjusting the contents of the first organic compound, the second organic compound, and the third organic compound in the plating solution as described above, the contents of sulfur, nitrogen, and carbon in the plating solution may be adjusted to sulfur: 0.00005% by mass or more and 0.005% by mass or less, nitrogen: 0.000001% by mass or more and 0.001% by mass or less, and carbon: 0.01% by mass or more and 0.5% by mass or less, respectively.

Such a forming material can be used as a plating solution used in a method for producing the flexible printed circuit board described later.

The lower limit of an average diameter of copper crystal grains in the copper-based plating layer 25 may be 0.05 μm, 0.1 μm, or 0.5 μm. The upper limit of the average diameter of copper crystal grains may be 100 μm, 50 μm, or 10 μm. If the average diameter of copper crystal grains is less than 0.05 μm, it may become difficult to more reliably set the electrical resistivity within the above range. On the other hand, if the average diameter of copper crystal grains exceeds 100 μm, similarly, it may become difficult to more reliably set the electrical resistivity within the above range. Herein, the average diameter is measured by the method described in Examples described later.

The average diameter of copper crystal grains can be appropriately adjusted by adding components other than the copper component in the forming material, for example, by changing the types of the organic compounds, the amounts of the organic compounds added, the electric density in electroplating, or the like.

Advantages

Since the flexible printed circuit board 10 has the average line width L and the average spacing S of the wiring lines 13 within the above ranges, a reduction in size is achieved. In addition, since the wiring lines 13 have the copper-based plating layer 25, the electrical resistance of the wiring lines can be increased in comparison among wiring lines having the same dimensions. Accordingly, the flexible printed circuit board 10 can conform to various design standards while achieving a reduction in size.

Method for Producing Flexible Printed Circuit Board

Next, a method for producing a flexible printed circuit board according to the present embodiment will be described using the flexible printed circuit board 10.

The method for producing the flexible printed circuit board 10 includes a plating step of forming a copper-based plating layer 25 on a conductive underlying layer M of a base film by electroplating using a resist pattern R1 in a plating solution, the base film 3 having the conductive underlying layer M on at least one surface side (front surface side) thereof; and a removal step of removing the resist pattern R1 and a region of the conductive underlying layer M, the region not having the copper-based plating layer 25 thereon. The plating solution contains sulfur, nitrogen, and carbon. In the plating solution, the sulfur content is 0.00005% by mass or more and 0.005% by mass or less, the nitrogen content is 0.000001% by mass or more and 0.001% by mass or less, and the carbon content is 0.01% by mass or more and 0.5% by mass or less.

Conductive Underlying Layer

Figure 3:
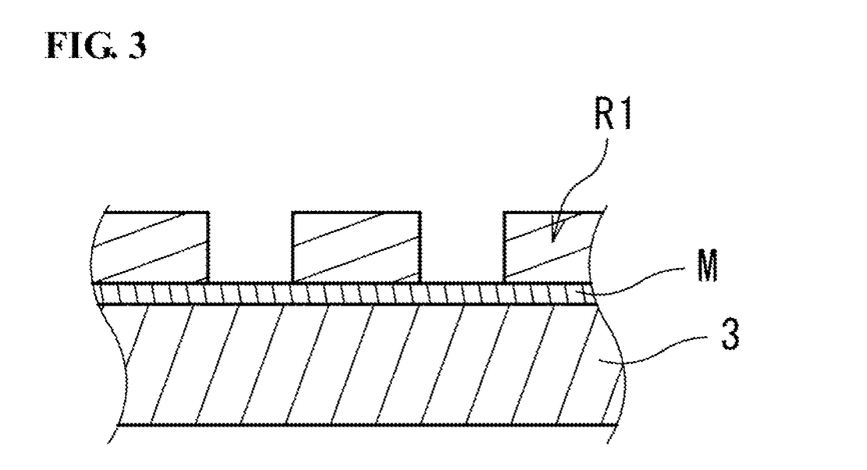
FIG. 3 is a schematic end view for explaining a method for producing the flexible printed circuit board in FIG. 1.

The conductive underlying layer M is stacked on the front surface side of the base film 3. The conductive underlying layer M used is a conductive underlying layer that is stacked in advance over the entire surface on the front surface side of the base film 3. A part of the conductive underlying layer M serves as the first conductive underlying layer 23.

Examples of the material that forms the conductive underlying layer M include copper (Cu), silver (Ag), gold (Au), nickel (Ni), titanium (Ti), chromium (Cr), and alloys thereof. With regard to these forming materials, the conductive underlying layer M may include a layer (first layer 231) containing at least one selected from the group consisting of nickel, chromium, titanium, and silver on the side in contact with the base film 3 (for example, polyimide) from the viewpoint of suppressing thermal deterioration of adhesive strength of the wiring layer 11 to the base film 3. Furthermore, the conductive underlying layer M more preferably includes a layer (first layer 231) containing at least one selected from nickel and chromium, which are easily removed to easily maintain insulation. In addition, the conductive underlying layer M more preferably includes a layer (second layer 232) containing copper as a main component on the upper side (the side opposite to the base film 3) of this first layer 231. This configuration in which the layer containing copper as a main component is disposed can shorten the time of operation when the wiring layer 11 is formed by electroplating.

For example, the lower limit of an average thickness of the first layer 231 may be 1 nm or 2 nm. The upper limit of the average thickness of the first layer 231 may be 15 nm or 8 nm. If the average thickness is less than 1 nm, it may become difficult to suppress thermal deterioration of adhesive strength of the wiring layer 11 to the base film 3. On the other hand, if the average thickness exceeds 15 nm, it may become difficult to easily remove the first layer 231, and insulation of the wiring layer 11 may not be sufficiently maintained. This first layer 231 can be formed by, for example, sputtering, electroplating, or electroless plating.

For example, the lower limit of an average thickness of the second layer 232 may be 0.1 μm or 0.2 μm. The upper limit of the average thickness of the second layer 232 may be 2 μm or 1 μm. If the average thickness is less than 0.1 μm, the time taken to form the wiring layer 11 by electroplating may become excessively long. On the other hand, if the average thickness exceeds 2 μm, it may become difficult to easily remove the second layer 232, and insulation of the wiring layer 11 may not be sufficiently maintained. This second layer 232 is preferably formed by, for example, sputtering, electroplating, or electroless plating and may be formed by a combination of these methods. In particular, an electroless copper plating layer is preferably disposed on the uppermost surface side of the conductive underlying layer M. With this configuration, in the case where an inner layer inside the electroless copper plating layer is formed by sputtering, defects and the like that can be generated by the sputtering can be covered.

Plating Step

This step includes a resist pattern forming step of forming a resist pattern R1 on a surface of a conductive underlying layer M, and a copper-based plating layer forming step of forming a copper-based plating layer 25 by depositing a first metal material on the conductive underlying layer M by electroplating using the formed resist pattern R1.

Resist Pattern Forming Step

In this step, a resist pattern R1 is formed on a surface of a conductive underlying layer M, as illustrated in FIG. 3. Specifically, a resist film such as a photosensitive film is stacked on a surface of a conductive underlying layer M, and the stacked resist film is exposed to light and developed to thereby form a resist pattern R1 having a predetermined pattern. Examples of the method for stacking the resist film include a method of applying a resist composition to the surface of the conductive underlying layer M and a method of stacking a dry film photoresist on the surface of the conductive underlying layer M. The exposure and development conditions for the resist film can be appropriately adjusted in accordance with, for example, the resist composition used. Openings of the resist pattern R1 can be appropriately determined in accordance with the copper-based plating layer 25 to be formed.

Copper-Based Plating Layer Forming Step

In this step, a plating solution contains sulfur, nitrogen, and carbon. In the plating solution, the sulfur content is 0.00005% by mass or more and 0.005% by mass or less, the nitrogen content is 0.000001% by mass or more and 0.001% by mass or less, and the carbon content is 0.01% by mass or more and 0.5% by mass or less. As such a plating solution, a plating solution that contains the forming material described above can be used.

Figure 4:
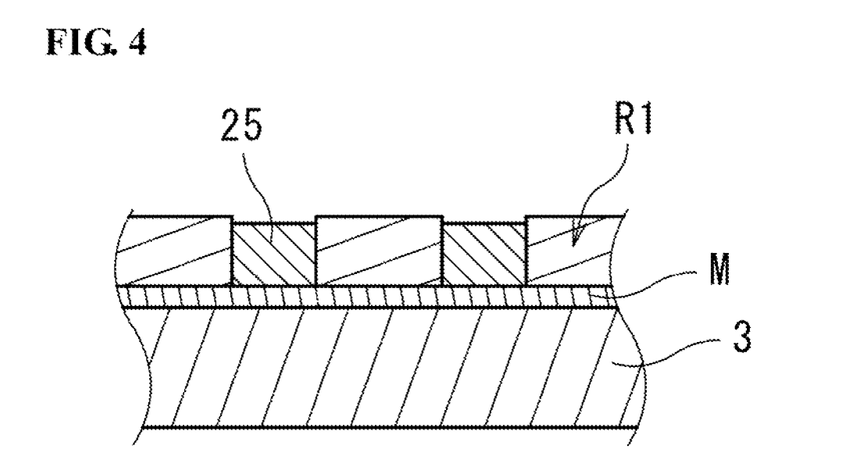
FIG. 4 is a schematic end view for explaining the method for producing the flexible printed circuit board in FIG. 1.

In this step, for example, the first metal material, e.g., a copper supply source such as a copper salt, and a mixture of the first organic compound, the second organic compound, and the third organic compound are blended such that the contents of sulfur, nitrogen, and carbon are within the ranges and used as the plating solution. In this step, the first metal material is deposited by electroplating using this plating solution, while electricity is supplied to the conductive underlying layer M, to thereby form a copper-based plating layer 25 in a region of the conductive underlying layer M, the region not having the resist pattern R1 thereon, as illustrated in FIG. 4.

To set the contents of sulfur, nitrogen, and carbon in the plating solution to the corresponding contents, the lower limit of the content of the first organic compound in the plating solution may be 0.0001% by mass, 0.0005% by mass, or 0.001% by mass, as described above. The upper limit of the content of the first organic compound in the plating solution may be 1% by mass, 0.1% by mass, or 0.05% by mass, as described above.

To set the contents of sulfur, nitrogen, and carbon in the plating solution to the corresponding contents, the lower limit of the content of the second organic compound in the plating solution may be 0.004% by mass, 0.02% by mass, or 0.04% by mass, as described above.

The upper limit of the content of the second organic compound in the plating solution may be 5% by mass or 1% by mass, and is more preferably 0.5% by mass, as described above.

To set the contents of sulfur, nitrogen, and carbon in the plating solution to the corresponding contents, the lower limit of the content of the third organic compound in the plating solution may be 0.0001% by mass, 0.0005% by mass, or 0.001% by mass. The upper limit of the content of the third organic compound in the plating solution may be 0.5% by mass, 0.1% by mass, or 0.005% by mass.

For example, the adjustment of the current density in electroplating of this step enables the electrical resistivity of the copper-based plating layer to be adjusted in more detail. This current density can be appropriately set in accordance with, for example, the above-described contents of the organic compounds in the plating solution. In addition, the adjustment of this current density enables the average diameter of copper crystal grains in the copper-based plating layer 25 to be adjusted, as described above.

Removal Step

This step includes a stripping step of stripping the resist pattern R1 from the conductive underlying layer M, and an etching step of etching a region (unnecessary region) of the conductive underlying layer M, the region not having the copper-based plating layer 25 thereon.

Stripping Step

In this step, the resist pattern R1 is stripped from the conductive underlying layer M. A publicly known stripping solution can be used as a stripping solution for this. Examples of the stripping solution include alkaline aqueous solutions of sodium hydroxide, potassium hydroxide, or the like; organic acid-based solutions of an alkylbenzenesulfonic acid or the like; and liquid mixtures of an organic amine such as ethanolamine and a polar solvent.

Etching Step

In this step, the conductive underlying layer M is etched by using the copper-based plating layer 25 as a mask. By this etching, wiring lines 13 including the first conductive underlying layer 23 and the copper-based plating layer 25 that are stacked on the base film 3 are obtained, as illustrated in FIG. 1. An etchant that corrodes the metal forming the conductive underlying layer M is used for the etching. In this production method, the so-called semi-additive method is suitably employed in this manner.

Advantages

According to the method for producing the flexible printed circuit board 10, the flexible printed circuit board 10 described above can be produced. That is, it is possible to produce the flexible printed circuit board 10 that can conform to various design standards while achieving a reduction in size.

Other Embodiments

It is to be understood that the embodiments disclosed herein are only illustrative and non-restrictive in all respects. The scope of the present invention is not limited to the configurations of the embodiments but is defined by the appended claims. The scope of the present invention is intended to cover all modifications within the meaning and scope equivalent to those of the claims.

In the embodiments, a description has been made of a flexible printed circuit board that includes a single base film and a wiring layer stacked on one of surfaces of the base film; however, the flexible printed circuit board may include a single base film and wiring layers stacked on both surfaces of the base film. Alternatively, the flexible printed circuit board may be a multilayer printed circuit board that includes a plurality of base films, in which each of the base films has a plurality of wiring layers on one surface or both surfaces thereof. In this case, the wiring layers on both surfaces can be electrically connected to each other via land parts.

In the embodiments, the case where one wiring layer is stacked on a base film has been described. Alternatively, a plurality of wiring layers may be stacked on a base film so as to be spaced apart from each other.

In the embodiments, the case where a wiring layer includes wiring lines having the specific copper-based plating layer has been described; however, an aspect in which a wiring layer includes other wiring lines in addition to such wiring lines can also be employed.

EXAMPLES

The present invention will be more specifically described below by way of Examples. However, the present invention is not limited to the following Examples.

Preparation of Samples

Examples 1 to 4 and Comparative Examples 1 to 3

A film (UPILEX (registered trade mark)-S, manufactured by Ube Industries, Ltd.) including a base film and a conductive underlying layer stacked on one surface side (front surface side) of the base film was used. A plating solution prepared by mixing, in addition to 75 g/L of copper sulfate and 190 g/L of sulfuric acid, SPS, PEG, and a copolymer of diallyl ammonium and sulfur dioxide in the corresponding blending amounts shown in Table 1 was used as a material for forming a copper-based plating layer. In Table 1, the symbol "-" indicates that the corresponding component is not added. A wiring layer having the above-described wiring lines as illustrated in FIG. 1 was formed on the conductive underlying layer of the film by using the film and the plating solution. Specifically, a copper-based plating layer was formed on the conductive underlying layer by electroplating at each current density described in Table 1 using the resist pattern described above with the plating solution in an electroplating tank, while electricity is supplied to the conductive underlying layer. The removal step was then performed as described above to prepare circuit boards of Examples 1 to 4 and Comparative Examples 1 to 3 having wiring lines with an average line width of 15 μm, an average spacing of 15 μm, and an average thickness of 15 μm. The contents (concentrations) of sulfur, nitrogen, and carbon in the copper-based plating layer, the average diameter of copper crystal grains, and the electrical resistivity of the copper-based plating layer in each of the obtained circuit boards were measured as described below.

Measurement of Contents of Sulfur, Nitrogen, and Carbon

The copper-based plating layer was peeled off and collected, and the measurement was performed by the following methods.

Contents of Sulfur and Carbon

The contents of sulfur and carbon in the copper-based plating layer were measured on the basis of the high frequency combustion-infrared absorption method. An apparatus with an apparatus model number: CSLS600 (manufactured by LECO Corporation) was used. The sulfur content was measured was measured in accordance with the method of JISH1070 (2013). The carbon content was measured in accordance with the General rules for determination of carbon in metallic materials of JISZ2615 (2015) and on the basis of JISG1211-3 (2018).

Content of Nitrogen

The content of nitrogen in the copper-based plating layer was measured by the inert gas transportation fusion-thermal conductivity method. An apparatus with an apparatus model number: TC600 (manufactured by LECO Corporation) was used. The measurement of the nitrogen content was performed on the basis of Appendix 4 in JISG1228 (2006).

Average Diameter of Copper Crystal Grains

The average diameter of copper crystal grains in the copper-based plating layer of each of the circuit boards was measured by observing a section prepared by cutting with an FIB apparatus, as described above.

Electrical Resistivity

For the copper-based plating layer of each of the circuit boards of Examples 1 to 4 and Comparative Examples 1 to 3, the electrical resistivity was measured by the four point probe method. The results are shown in Table 1.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| Plating solution | SPS concentration [mass %] | 0.002 | 0.002 | 0.005 | 0.005 | — | — | 0.00005 |
|  | PEG concentration [mass %] | 0.05 | 0.05 | 0.1 | 0.1 | — | — | 0.01 |
|  | Concentration of copolymer of diallyl ammonium and sulfur dioxide [mass %] | 0.0005 | 0.0005 | 0.001 | 0.002 | — | — | 0.00005 |
| Copper-based plating layer | Sulfur concentration [mass %] | 0.0005 | 0.0005 | 0.001 | 0.001 | 0.00001 | 0.00001 | 0.00002 |
|  | Nitrogen concentration [mass %] | 0.0005 | 0.0005 | 0.0005 | 0.001 | 0.00001 | 0.00001 | 0.00003 |
|  | Carbon concentration [mass %] | 0.002 | 0.002 | 0.005 | 0.005 | 0.00001 | 0.0001 | 0.00001 |
|  | Average diameter of copper crystal grains [μm] | 5 | 3 | 2 | 2 | 25 | 20 | 15 |
|  | Current density [A/dm$^2$] | 1 | 2 | 1 | 1 | 1 | 2 | 2 |
|  | Electrical resistivity [Ω × m] | $1.76 \times 10^{-8}$ | $1.85 \times 10^{-8}$ | $1.98 \times 10^{-8}$ | $2.10 \times 10^{-8}$ | $1.68 \times 10^{-8}$ | $1.68 \times 10^{-8}$ | $1.68 \times 10^{-8}$ |

In Examples 1 to 4, in which the sulfur content was 0.0001% by mass or more and 0.005% by mass or less, the nitrogen content was 0.0001% by mass or more and 0.005% by mass or less, and the carbon content was 0.001% by mass or more and 0.01% by mass or less, the electrical resistivity of the copper-based plating layer exceeded $1.68 \times 10^{-8}$ Ω·m. In contrast, in Comparative Examples 1, 2, and 3, in which the contents of sulfur, nitrogen, and carbon were each 0.00001% by mass, the electrical resistivity of the copper-based plating layer was $1.68 \times 10^{-8}$ Ω·m or less.

REFERENCE SIGNS LIST

10 flexible printed circuit board
3 base film
11 wiring layer
13 wiring line
23 first conductive underlying layer
231 first layer
232 second layer
25 copper-based plating layer
L average line width
S average spacing
M conductive underlying layer
R1 resist pattern

The invention claimed is:

1. A flexible printed circuit board comprising a base film and a wiring layer disposed on at least one surface of the base film and having a plurality of wiring lines,
    wherein the wiring lines have an average line width of 30 μm or less and an average spacing of 30 μm or less,
    the wiring lines have a copper-based plating layer,
    the copper-based plating layer has an electrical resistivity of more than $1.68 \times 10^{-8}$ Ω·m,
    the copper-based plating layer contains sulfur, nitrogen, and carbon, and
    in the copper-based plating layer, a content of the sulfur is 0.0001% by mass or more and 0.005% by mass or less, a content of the nitrogen is 0.0001% by mass or more and 0.005% by mass or less, and a content of the carbon is 0.001% by mass or more and 0.01% by mass or less.

2. The flexible printed circuit board according to claim 1, wherein the electrical resistivity of the copper-based plating layer is $1.73 \times 10^{-8}$ Ω·m or more and $2.10 \times 10^{-8}$ Ω·m or less.

3. The flexible printed circuit board according to claim 2, wherein the electrical resistivity of the copper-based plating layer is $1.76 \times 10^{-8}$ Ω·m or more and $1.93 \times 10^{-8}$ Ω·m or less.

4. The flexible printed circuit board according to claim 1, wherein copper crystal grains in the copper-based plating layer have an average diameter of 0.05 μm or more and 100 μm or less.

5. The flexible printed circuit board according to claim 1, wherein the wiring lines further include a first conductive underlying layer in contact with the one surface of the base film,
    the copper-based plating layer is disposed on a surface of the first conductive underlying layer, the surface being opposite to a surface in contact with the base film, and
    the first conductive underlying layer includes a first layer in contact with the one surface of the base film and a second layer disposed on a surface of the first layer, the surface being opposite to a surface in contact with the base film.

6. The flexible printed circuit board according to claim 5, wherein the first layer contains at least one selected from the group consisting of nickel, chromium, titanium, and silver.

7. The flexible printed circuit board according to claim 5, wherein the second layer contains 50% by mass or more of copper in the second layer.

8. The flexible printed circuit board according to claim 1, wherein, in the copper-based plating layer, a content of the sulfur is 0.0005% by mass or more and 0.001% by mass or less, a content of the nitrogen is 0.0005% by mass or more and 0.001% by mass or less, and a content of the carbon is 0.002% by mass or more and 0.005% by mass or less.

9. The flexible printed circuit board according to claim 1, wherein copper crystal grains in the copper-based plating layer have an average diameter of 2 μm or more and 100 μm or less.

10. The flexible printed circuit board according to claim 1, wherein copper crystal grains in the copper-based plating layer have an average diameter of 2 μm or more and 10 μm or less.

* * * * *